(12) United States Patent
Jung et al.

(10) Patent No.: US 7,501,590 B2
(45) Date of Patent: Mar. 10, 2009

(54) MOLDING RESIN TABLET FEEDING APPARATUS HAVING WEIGHING UNIT

(75) Inventors: Ok-Sun Jung, Cheonan-si (KR); Hee-Chul Kang, Cheonan-si (KR); Byong-Do Na, Cheonan-si (KR); Young-Jin Hwang, Cheonan-si (KR); Do-Woo Lee, Cheonan-si (KR); Yong-Hwan Kim, Cheonan-si (KR); Hee-Ju Seo, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 436 days.

(21) Appl. No.: 11/316,812

(22) Filed: Dec. 27, 2005

(65) Prior Publication Data

US 2007/0023208 A1  Feb. 1, 2007

(30) Foreign Application Priority Data

Jul. 27, 2005   (KR) ...................... 10-2005-0068420

(51) Int. Cl.
*B07C 5/16* (2006.01)
(52) U.S. Cl. .................... 177/52; 177/105; 177/116; 177/145; 209/592
(58) Field of Classification Search ................. 209/592; 177/52, 105, 116, 119, 145
See application file for complete search history.

(56) References Cited

U.S. PATENT DOCUMENTS

| 2,161,190 | A | * | 6/1939 | Paull | ........................ 222/252 |
| 6,111,206 | A | * | 8/2000 | Maguire | ..................... 177/60 |
| 6,238,616 | B1 | * | 5/2001 | Ishikawa et al. | ............ 264/553 |
| 6,478,162 | B1 | * | 11/2002 | Yamamoto et al. | .......... 209/593 |
| 6,877,611 | B2 | * | 4/2005 | Yamamoto et al. | .......... 209/646 |
| 2003/0019797 | A1 | * | 1/2003 | Yamamoto et al. | .......... 209/592 |

FOREIGN PATENT DOCUMENTS

| JP | 07-045648 | 2/1995 |
| JP | 2001-203224 | 7/2001 |
| KR | 10-2004-0017422 | 7/2004 |

* cited by examiner

*Primary Examiner*—Randy W Gibson
(74) *Attorney, Agent, or Firm*—Harness, Dickey & Pierce

(57) ABSTRACT

A molding resin tablet feeding apparatus may have a tablet weighing unit for weighing a molding resin tablet to sort out a faulty molding resin tablet. The weighing unit may be elastically deformed according to the weight of the molding resin tablet, and may further include a strain gauge for outputting an electric change caused by the elastic deformation. A controller may compare the electric change to tablet weight information to determine the validity of the molding resin tablet.

20 Claims, 15 Drawing Sheets

MOLDING RESIN TABLET FEEDING APPARATUS HAVING WEIGHING UNIT

PRIORITY STATEMENT

This U.S. non-provisional application claims benefit of priority under 35 U.S.C. §119 from Korean Patent Application No. 2005-68420, filed on Jul. 27, 2005, the entire contents of which are incorporated herein by reference.

BACKGROUND

1. Field of the Invention

Example embodiments of the present invention relate to a semiconductor manufacturing technique, and more particularly, to a molding resin tablet feeding apparatus having a weighing unit.

2. Description of the Related Art

Numerous processes may be implemented to fabricate a semiconductor package. Such processes may include, but are not limited to, a chip attaching process for attaching an integrated circuit chip to a package substrate, a wire bonding process for electrically connecting the integrated circuit chip to the package substrate using conductive wires, and a molding process for forming a package using a molding resin.

The molding process may involve providing a molding resin on various parts of the package. The molding resin may protect the integrated circuit chip and the conductive wires from the external environment, for example shocks, heat and/or moisture. By way of example only, the molding resin may be an epoxy molding compound that may include an epoxy resin and various compositions, for example a curing agent, a curing catalyst, other additives and/or an inorganic filler. Numerous and varied molding resins are well known in this art.

The molding resin may be provided in a solid state, which may be referred to as a tablet. By way of example only, the molding resin tablet may have a cylindrical shape. The molding resin tablet may be melted in a molding system and restored to a solid state after a curing process. The molding resin tablet may be sized according to the type of package and/or the kind of a molding system, for example.

In some instances, the molding resin tablet may be flawed, e.g., chipped and/or broken due to external shocks. A flawed (or faulty) molding resin tablet may result in defects such as an incomplete molding (for example), which may reduce the reliability of a package.

SUMMARY

According to an example, non-limiting embodiment, a molding resin tablet feeding apparatus may include a tablet chute block having at least one chute to receive a molding resin tablet. A support unit may be provided below the tablet chute block. The support unit may be moveable between a first position to retain the molding resin tablet in the chute and a second position to release the molding resin tablet from the chute. A weighing unit may be provided below the tablet chute block to weigh the molding resin tablet in the chute. A controller may be electrically connected to the tablet chute block, the support unit and the weighing unit to accept or reject the molding resin tablet. The support unit may move to the second position when the controller rejects the molding resin tablet.

According to another example, non-limiting embodiment, a molding resin tablet feeding apparatus may include a tablet chute block having at least one chute for receiving a molding resin tablet. A weighing unit may be provided below the tablet chute block. The weighing unit may be moveable between a first position to weigh and retain the molding resin tablet in the chute and a second position to release the molding resin tablet from the chute. A controller may be electrically connected to the tablet chute block and the weighing unit to accept or reject the molding resin tablet. The weighing unit may move to the second position when the controller rejects the molding resin tablet.

According to another example, non-limiting embodiment, a method of feeding a molding resin tablet may involve inserting a molding resin tablet into a chute of a chute block. The molding resin tablet in the chute may be weighed. The molding resin tablet may be determined to be acceptable based on the weighing.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the elements illustrated in the various embodiments may have been reduced, expanded and/or rearranged to improve the clarity of the figure with respect to the corresponding description. The figures, therefore, should not be interpreted as accurately reflecting the relative sizing and/or positioning of the corresponding structural elements that could be encompassed by an actual device manufactured according to the example, non-limiting embodiments of the invention.

DETAILED DESCRIPTION OF EXAMPLE, NON-LIMITING EMBODIMENTS

Example, non-limiting embodiments of the present invention will be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Well-known structures and processes are not described or illustrated in detail to avoid obscuring the present invention.

Figure 1:
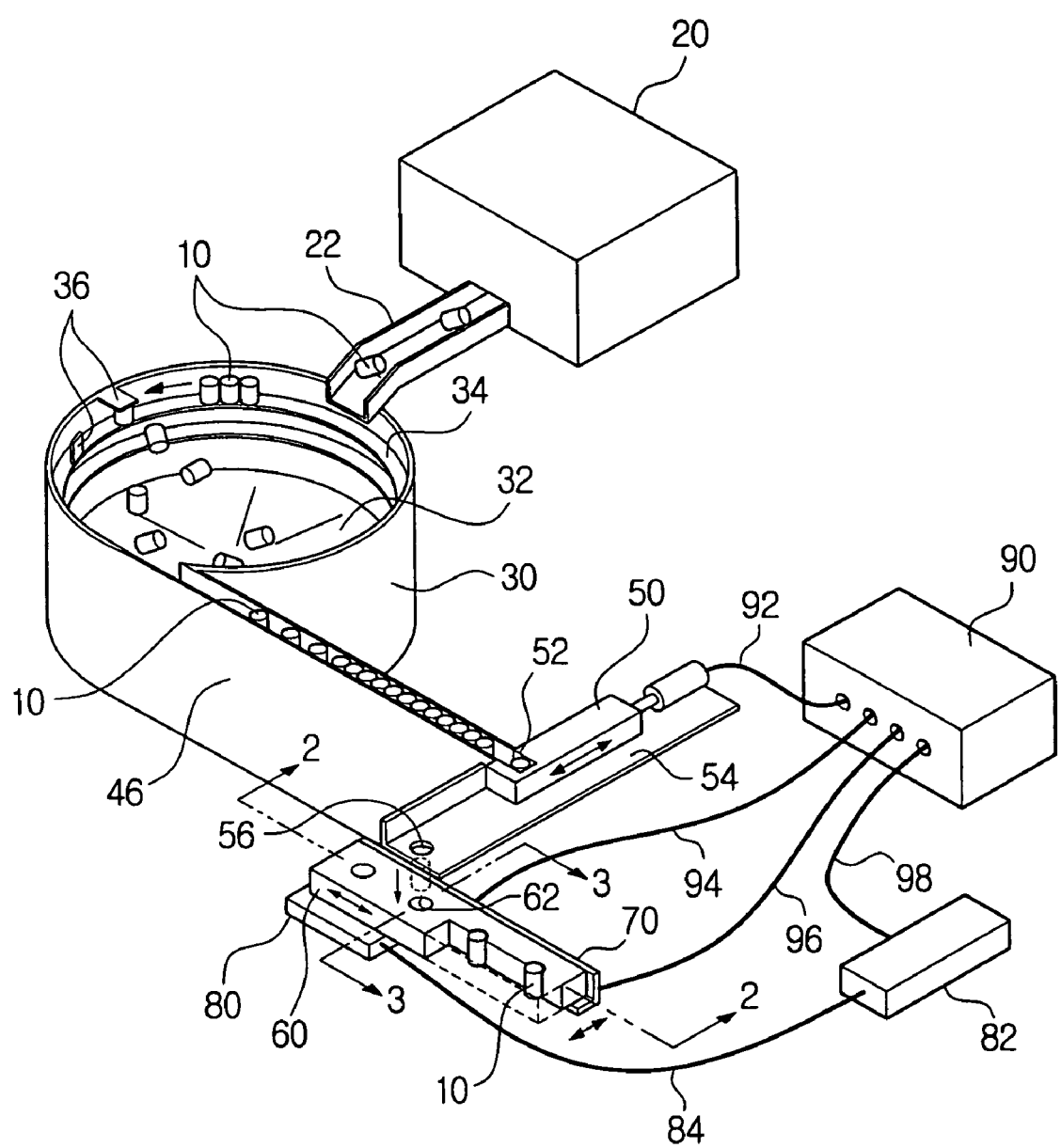
FIG. 1 is a schematic perspective view of a molding resin tablet feeding apparatus in accordance with an example, non-limiting embodiment of the present invention.

FIG. 1 is a schematic perspective view of a molding resin tablet feeding apparatus 100 in accordance with an example, non-limiting embodiment of the present invention.

Referring to FIG. 1, and by way of example only, the molding resin tablet feeding apparatus 100 may include a tablet feeder 20, a bowl feeder 30, a bowl feeder output track 46, a separator 50, a tablet chute block 60, a support unit 70, a weighing unit 80, and a controller 90. The apparatus 100 may automatically provide a molding resin tablet 10 to a molding system (not shown).

The tablet feeder 20 may contain molding resin tablets 10 and have an outlet 22 for discharging the molding resin tablets 10. The bowl feeder 30 may have a conic surface 32, a spiral track 34 and a sorter 36. The conic surface 32 may be inclined downwards from the center to the edge. The edge of the conic surface 32 may be connected to an input end of the spiral track 34. Molding resin tablets 10 may be discharged from the outlet 22 and onto the conic surface 32. The molding resin tablets 10 may move to the edge of the conic surface 32 and onto the input end of the spiral track 34. The sorter 36 may be provided along the spiral track 34 to sort the molding resin tablets 10 according to height and/or diameter standards (for example).

The bowl feeder output track 46 may be connected to an output end of the spiral track 34. The bowl feeder conveyor 46 may transfer the molding resin tablet 10 to the separator 50.

The separator 50 may be provided at the end of the bowl feeder output track 46. The separator 50 may have a groove 52 for receiving a molding resin tablet 10. A support plate 54 may support the separator 50 and the molding resin tablet 10 in the groove 52. The separator 50 may be moved on the support plate 54 by a driver, for example an air cylinder (not shown). The support plate 54 may have a slot 56. When a molding resin tablet 10 is received in the groove 52, the separator 50 may move towards the slot 56 so that the molding resin tablet 10 may drop from the separator and pass through the slot 56.

The tablet chute block 60 may deliver the molding resin tablet 10 to a mold port block (not shown) of a molding system. The tablet chute block 60 may have at least one chute 62 that receives the molding resin tablet 10. In this example embodiment, the chute 62 may be vertically oriented. In alternative embodiments, the chute 62 may be inclined relative to vertical. The tablet chute block 60 may be moved by a driver, for example an air cylinder (not shown). The detailed description of the tablet chute block 60 will be made below.

The support unit 70 may be provided below the tablet chute block 60. The support unit 70 may be moved by a driver (e.g., an air cylinder) to selectively obstruct the passage of the molding resin tablet 10 through the chute 62. For example, the support unit 70 may be retracted (or moved in a direction away from the tablet chute block 60) to clear the lower opening of the chute 62 so that the molding resin tablet 10 may pass through the chute 62. The support unit 70 may also be advanced (or moved in a direction toward the tablet chute block 60) to at least partially cover the lower opening of the chute 62 so that the molding resin tablet 10 may be supported by the support unit 70.

The weighing unit 80 may be provided below the tablet chute block 60. The weighing unit 80 may weigh the molding resin tablet 10. By way of example only, the weighing unit 80 may include a load cell having a strain gauge. A converter 82 may be electrically connected to the weighing unit 80.

The controller 90 may be electrically connected to various component parts of the molding resin tablet feeding apparatus 100 through electric wires 92, 94, 96 and 98 to control the molding resin tablet feeding apparatus 100.

The load cell of the weighing unit 80 may have an elastic body fabricated from metal (for example). The strain gauge of the weighing unit 80 may be attached to the elastic body. When an object is placed on the load cell, the elastic body may be deformed under the weight of the object, thereby changing the resistance of the strain gauge. Power may be applied to the strain gauge and an output voltage may be amplified to measure a voltage variation. The measured voltage variation may provide an indication of the amount of deformation of the elastic body and thus the weight of the object supported by the elastic body. The functionality of numerous and alternative strain gauges is well known in this art.

The weighing unit 80 may convert a physical deformation of the elastic body to an electric change, and amplify and output the electric change. The output signal may be an analog voltage signal. The converter 82 may convert the analog signal to a digital signal perceivable by the controller 90. The digital signal may be formatted according to RS232C, RS-422 and/or BCD (for example). The converter 82 may transmit the digital signal to the controller 90. The controller 90 may compare the digital signal with tablet weight information stored in the controller 90 to determine an accept/reject status of the molding resin tablet 10. The controller 90 may also control the tablet chute block 60, the support unit 70 and the weighing unit 80, according to the accept/reject status determination.

The operation of the molding resin tablet feeding apparatus 100 is described with reference to FIGS. 2A through 2D and FIGS. 3A through 3D.

FIGS. 2A through 2D are schematic cross-sectional views taken along the line 2-2 of FIG. 1, showing the operation of the molding resin tablet feeding apparatus in accordance with an example, non-limiting embodiment of the present invention. FIGS. 3A through 3D are schematic cross-sectional views taken along the line 3-3 of FIG. 1, showing the operation of a molding resin tablet feeding apparatus in accordance with an example, non-limiting embodiment of the present invention.

Figure 2A:
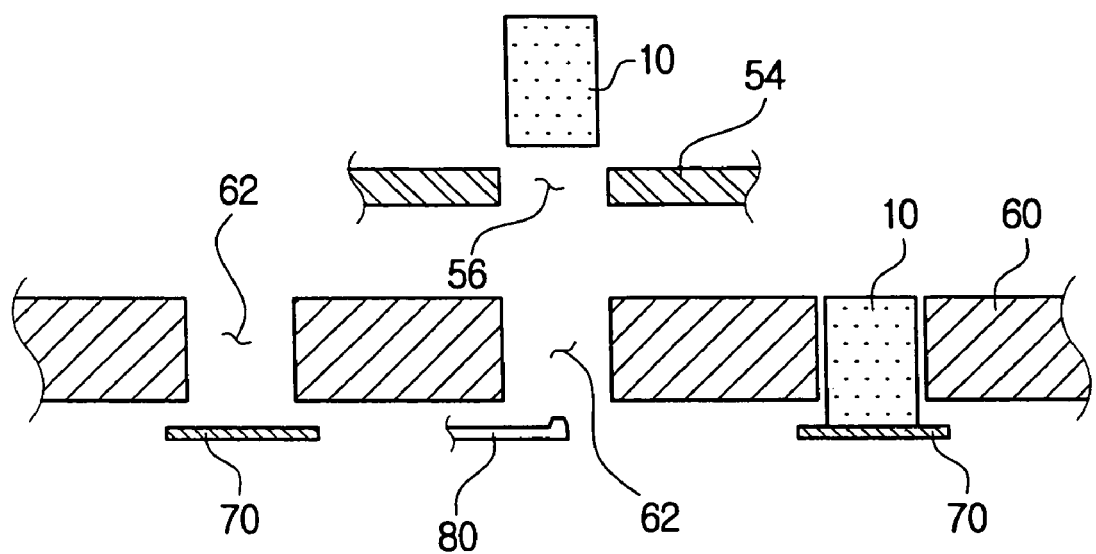
FIGS. 2A through 2D are schematic cross-sectional views taken along the line 2-2 of FIG. 1, showing the operation of a molding resin tablet feeding apparatus in accordance with an example, non-limiting embodiment of the present invention.
Figure 3A:
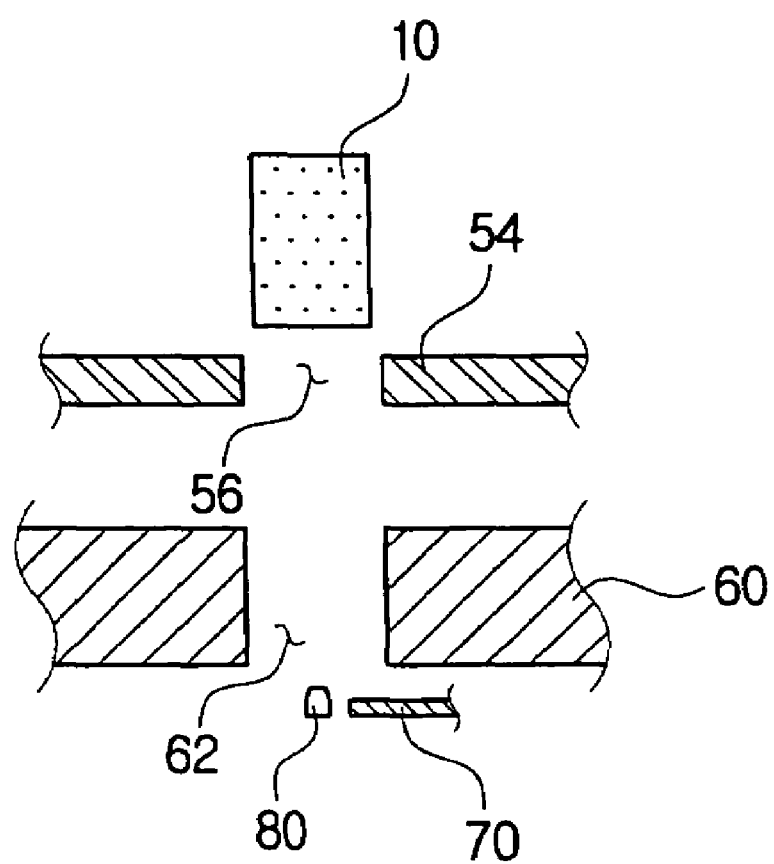
FIGS. 3A through 3D are schematic cross-sectional views taken along the line 3-3 of FIG. 1, showing the operation of a molding resin tablet feeding apparatus in accordance with an example, non-limiting embodiment of the present invention.

Referring to FIGS. 2A and 3A, a molding resin tablet 10 may pass through the slot 56 of the support plate 54 and enter into a chute 62 of the tablet chute block 60 that corresponds to the slot 56. The corresponding chute 62 of the tablet chute block 60 may be located at a receiving position. In this example embodiment, the receiving position may be directly below the slot 56. In alternative embodiments, guides may be suitably implemented so that the receiving position may be laterally offset from the slot 56. If the tablet chute block 60 includes a plurality of chutes 62, then the tablet chute block 60 may be moveable so that each of the chutes 62 may be alternately located at the receiving position.

The molding resin tablet 10 in the chute 62 may be supported by a support unit 70, which may be provided below the tablet chute block 60. In this example embodiment, each individual chute 62 may be associated with an individual support unit 70 in a one-to-one relationship. In this regard, the support units 70 may be considered as being dedicated to a particular chute 62. The support units 70 may be advanced and/or retracted independently from each other. A weighing unit 80 may be provided below the tablet chute block 60. By way of example only, the support unit 70 may cover an outer portion of the lower opening of the chute 62, and the weighing unit 80 may cover a center portion of the lower opening of the chute 62. The top of the weighing unit 80 may be positioned higher than the upper surface of the support unit 70.

Figure 2B:
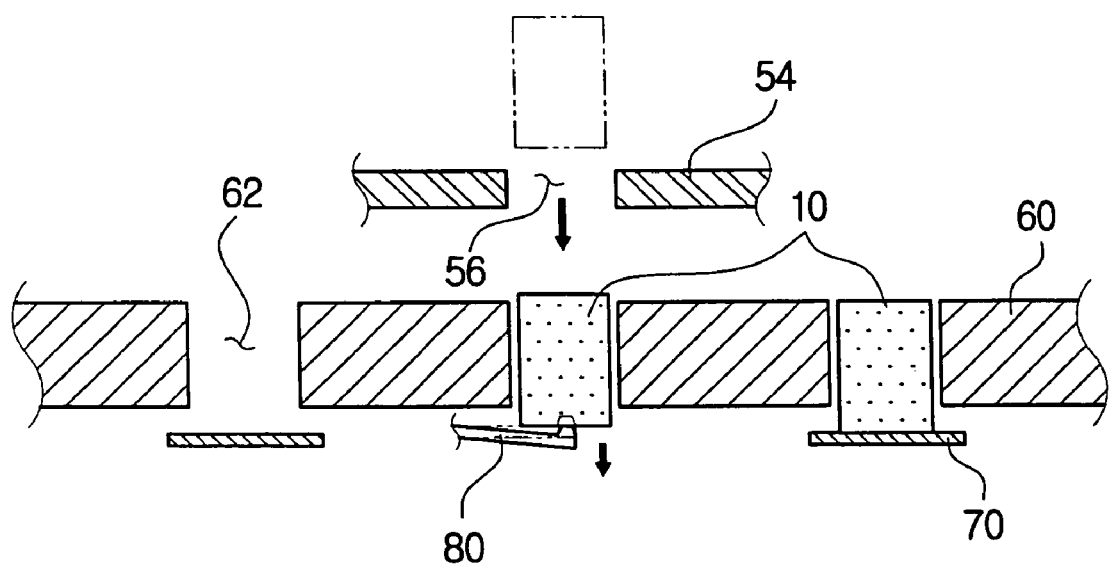
Figure 3B:
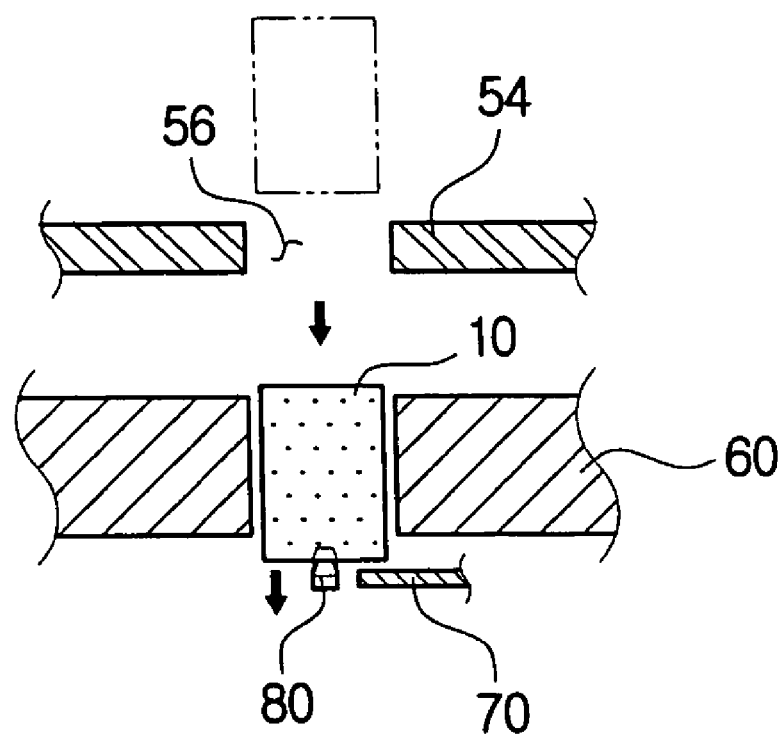

Referring to FIGS. 2B and 3B, the molding resin tablet 10 may be inserted into the chute 62 through the slot 56. The molding resin tablet 10 may contact the top of the weighing unit 80, before the molding resin tablet 10 contacts the support unit 70. The weighing unit 80 may be elastically deformed due to the weight of the molding resin tablet 10.

As mentioned above, the weighing unit 80 may convert a physical deformation to an electric change. The converter 82 may convert the electric change to a digital signal and transmit the digital signal to the controller 90. The controller 90 may compare the digital signal with tablet weight information to determine the accept/reject status of the molding resin tablet 10. For example, a given molding resin tablet 10 may be accepted by the controller 90 if the weighing unit 80 provides a weight measurement that is within a desired range of values (as set forth in the tablet weight information), and rejected otherwise. It will be appreciated that a reject status may be assigned to a molding resin tablet having a weight that is below a minimum threshold value and/or above a maximum threshold value.

Figure 2C:
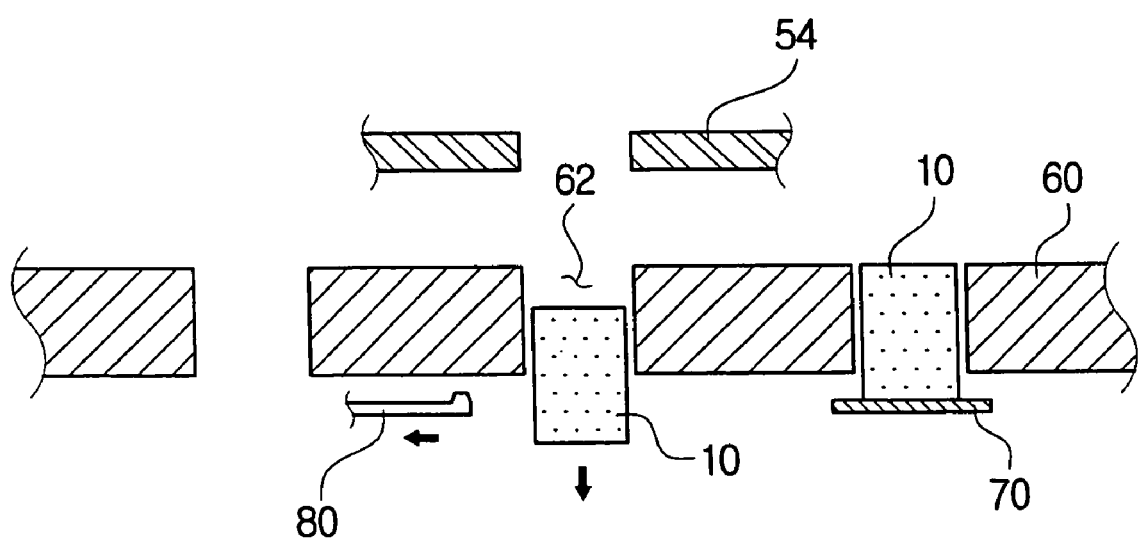
Figure 3C:
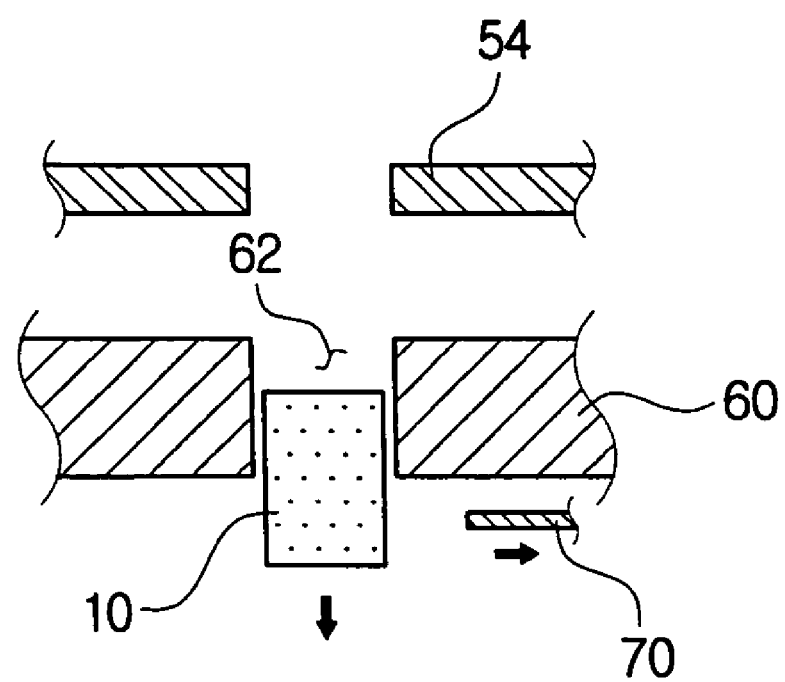

If the molding resin tablet 10 is rejected by the controller 90, then the molding resin tablet 10 may be discarded, as shown in FIGS. 2C and 3C. For example, the controller 90 may transmit a control signal to the support unit 70 and the weighing unit 80. The support unit 70 and the weighing unit 80 may move so as to clear the lower opening of the chute 62. In this way, the molding resin tablet 10 in the chute 62 (which may be located at the receiving position) may be discarded from the tablet chute block 60.

Figure 2D:
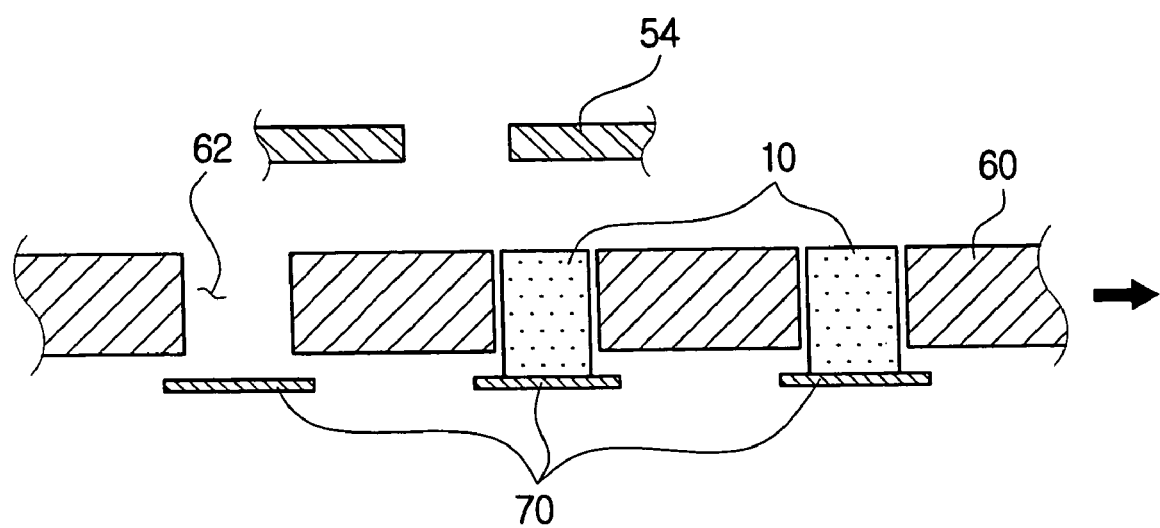
Figure 3D:
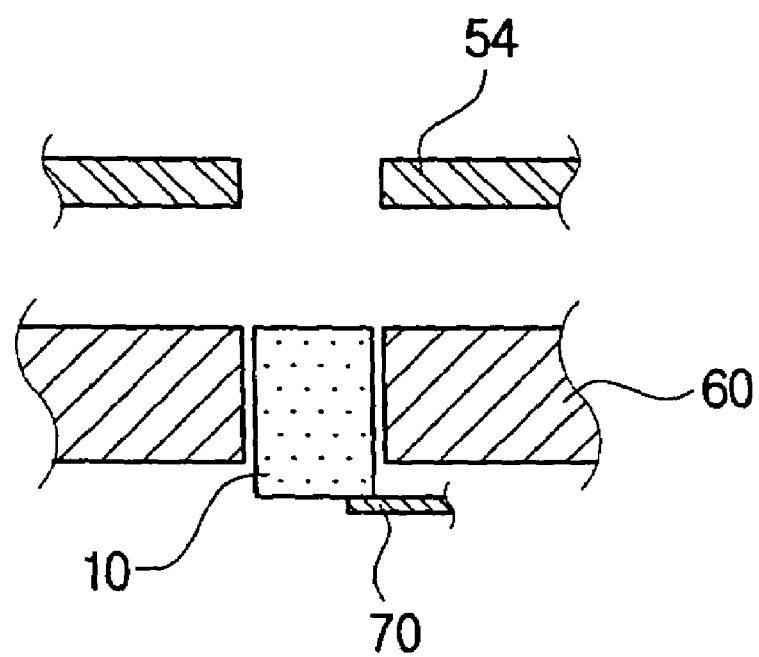

If the molding resin tablet 10 is accepted by the controller 90, a subsequent process may be performed as shown in FIGS. 2D and 3D. For example, the controller 90 may transmit a control signal to a driver of the tablet chute block 60. The tablet chute block 60 (and the support unit 70) may move so that another, empty chute 62 may be located at the receiving position. At this time, the controller 90 may (or may not) send a control signal to the weighing unit 80, causing the weighing unit to temporarily move to an idle position (away from the receiving position) and then return to the receiving position after the tablet chute block 60 has been repositioned. The molding resin tablet 10 in the chute 62 may exceed the range of the weighing unit 80 and be supported by the support unit 70. A next molding resin tablet 10 may be provided to a next chute 62. In this example embodiment, the support units 70 may be mounted on the tablet chute block 60 so that the support units 70 may move together with the tablet chute block 60. In this example embodiment, the advance and retract movements of the support units 70 may be in the direction of the width of the tablet chute block 60.

In this example embodiment, the molding resin tablets 10 may be individually weighed. In alternative embodiments, a plurality of molding resin tablets 10 may be weighed together, as shown in FIGS. 4A through 4C and FIGS. 5A through 5C.

Figure 4A:
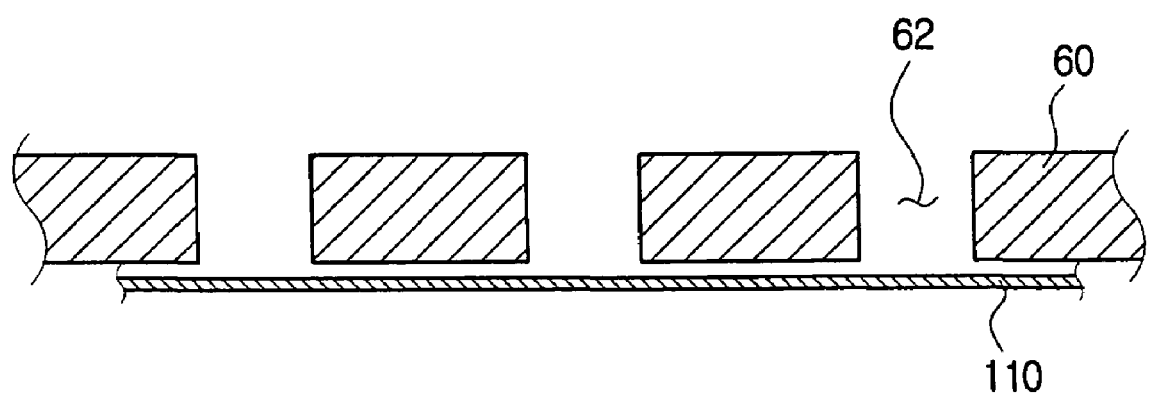
FIGS. 4A through 4C are schematic cross-sectional views taken from the same perspective as FIGS. 2A through 2D, but showing the operation of a molding resin tablet feeding apparatus in accordance with another example, non-limiting embodiment of the present invention.
Figure 4B:
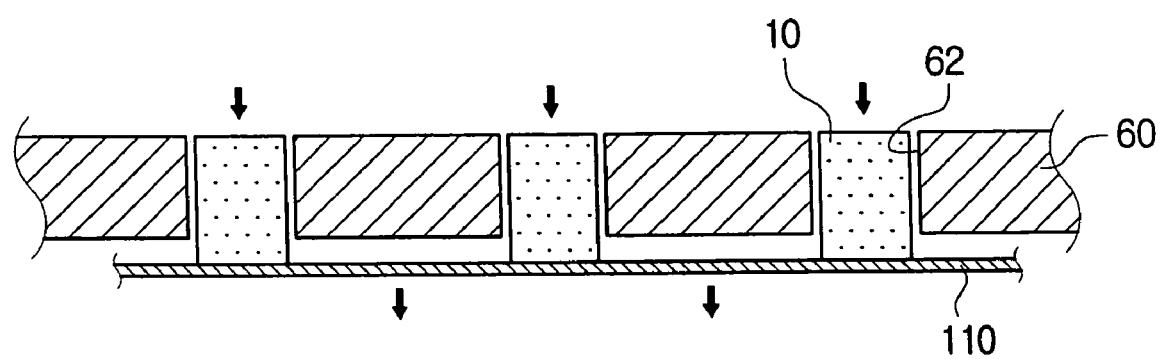
Figure 4C:
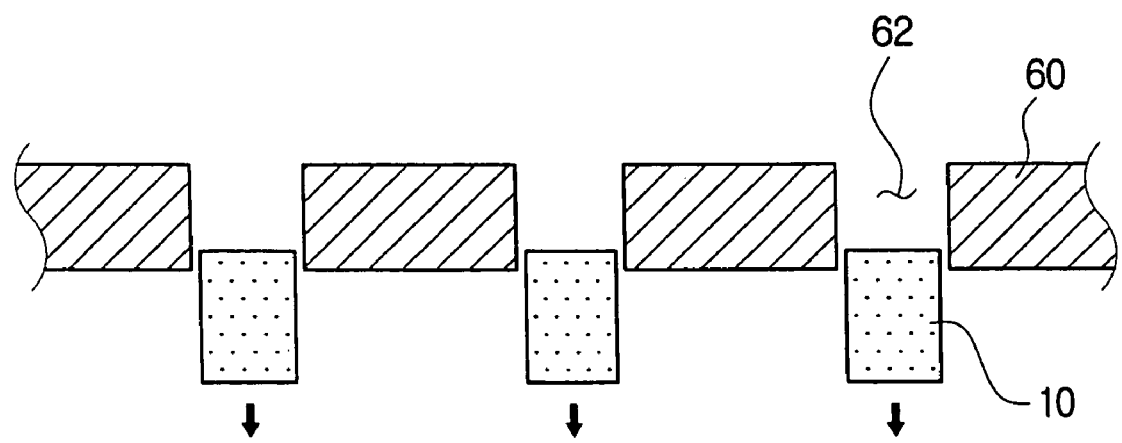
Figure 5A:
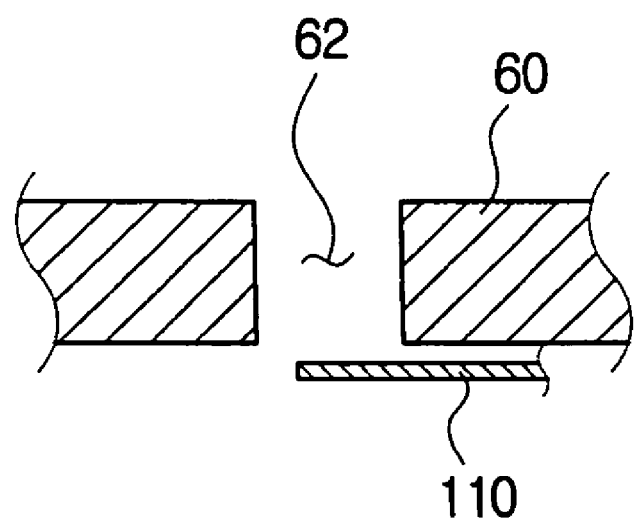
FIGS. 5A through 5C are schematic cross-sectional views taken from the same perspective as FIGS. 3A through 3D, but showing the operation of a molding resin tablet feeding apparatus in accordance with another example, non-limiting embodiment of the present invention.
Figure 5B:
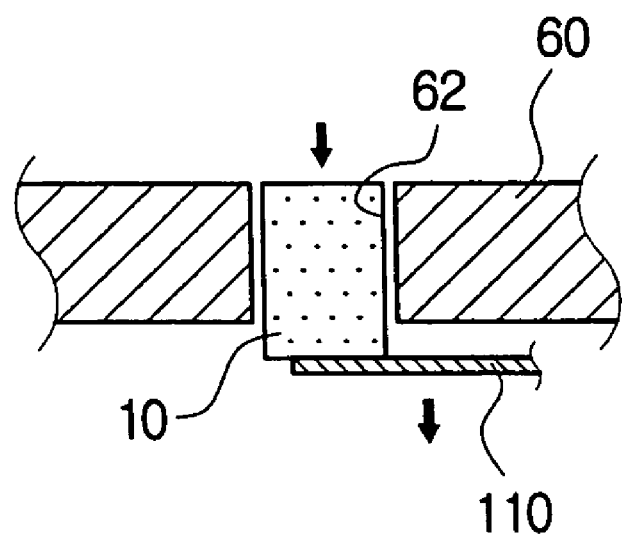
Figure 5C:
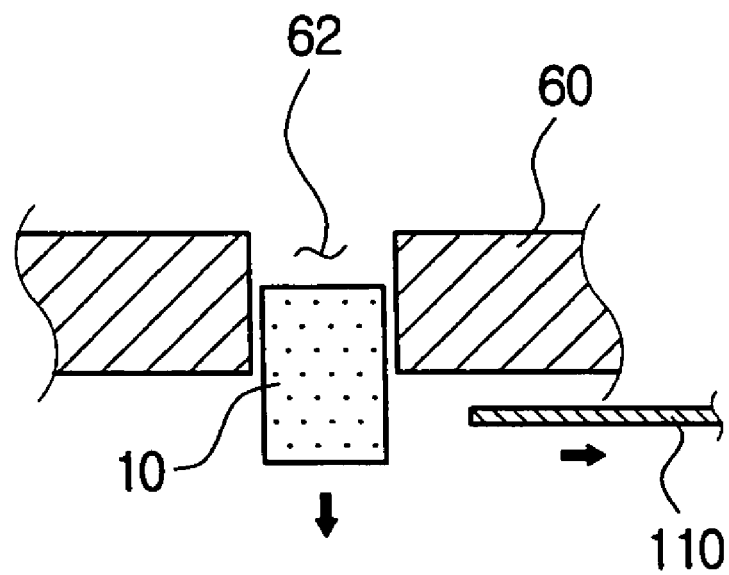

FIGS. 4A through 4C are schematic cross-sectional views taken from the same perspective as FIGS. 2A-2D, but showing the operation of a molding resin tablet feeding apparatus in accordance with another example, non-limiting embodiment of the present invention. FIGS. 5A through 5C are schematic cross-sectional views taken from the same perspective as FIGS. 3A-3D, but showing the operation of a molding resin tablet feeding apparatus in accordance with another example, non-limiting embodiment of the present invention.

Referring to FIGS. 4A and 5A, a molding resin tablet 10 may be provided to a tablet chute block 60. A weighing unit 110 may be provided below the tablet chute block 60. The weighing unit 110 may have a sufficient length to cover all of the chutes 62 of the tablet chute block 60. The weighing unit 110 may also serve as a support unit.

Referring to FIGS. 4B and 5B, the molding resin tablets 10 may be inserted into the chutes 62. The molding resin tablets 10 may be individually inserted in the same manner as in the previous example embodiment. The molding resin tablets 10 in the chutes 62 may be supported by the weighing unit 110. The weighing unit 110 may be elastically deformed under the weight of the molding resin tablets 10.

A physical deformation may be converted to an electric change. A converter 82 may convert the electric change to a digital signal and transmit the digital signal to a controller 90. The controller 90 may compare the digital signal with a tablet weight information and determine the accept/reject status of the molding resin tablets 10 collectively.

If the molding resin tablets 10 are collectively rejected by the controller 90, a subsequent process may be performed, as shown in FIGS. 4C and 5C. For example, the controller 90 transmits a control signal to the weighing unit 110. The weighing unit 110 may move so as to clear the lower openings of the chutes 62, thereby allowing the molding resin tablets 10 to fall from the tablet chute block 60. If the molding resin tablets 10 are collectively accepted by the controller 90, the tablet chute block 60 may move so as to transfer the molding resin tablets 10, similar to the movements described with respect to FIGS. 2D and 3D of the previous embodiment.

The weighing unit 110 (which also serves as the support unit) may be applied to the individual weighing embodiment. The weighing unit 80 separated from the support unit 70 may be applied to the collective weighing embodiment.

The weighing units 80 and 110 may be of a compression type and/or a tension type, both of which are well known in this art. A tablet transfer mechanism may be provided between the tablet chute block 60 and a mold port block. In this case, the weighing units 80 and 110 may be installed above the tablet transfer mechanism.

The example embodiments have been described for handling molding resin tablets having cylindrical shapes. In alternative embodiments, molding resin tablets having any other shape may be handled.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A molding resin tablet feeding apparatus comprising:
   a tablet chute block having at least one chute to receive a molding resin tablet;
   a support unit provided below the tablet chute block, the support unit moveable between a first position to retain the molding resin tablet in the chute and a second position to release the molding resin tablet from the chute;

a weighing unit provided below the tablet chute block to weigh the molding resin tablet in the chute; and a controller electrically connected to the tablet chute block, the support unit and the weighing unit to accept or reject the molding resin tablet;

wherein the support unit moves to the second position when the controller rejects the molding resin tablet, and wherein the support unit is configured to retain the molding resin tablet in the chute, without obstructing the ability of the weighing unit to weigh the molding resin tablet while in the chute.

2. The apparatus of claim 1, wherein the tablet chute block has a plurality of chutes to receive molding resin tablets.

3. The apparatus of claim 2, wherein the tablet chute block is moved a distance that is the same as the interval between the chutes to receive the molding resin tablet.

4. The apparatus of claim 2, wherein the support unit is independently operated for each chute of the tablet chute block.

5. The apparatus of claim 2, wherein the support unit extends across the chutes of the tablet chute block.

6. The apparatus of claim 2, wherein the weighing unit is located one of the chutes of the tablet chute block.

7. The apparatus of claim 1, wherein the weighing unit extends to a center portion of an opening of the chute and the support unit extends to a peripheral region of the opening of the chute.

8. The apparatus of claim 1, wherein the weighing unit is elastically deformed according to the weight of the molding resin tablet, and further includes a strain gauge for outputting an electric change generated by the elastic deformation.

9. The apparatus of claim 8, wherein the weighing unit is electrically connected to the controller, and further includes a converter for converting the electric change to a digital signal.

10. The apparatus of claim 8, wherein the top of the weighing unit is located higher than an upper surface of the support unit.

11. A molding resin tablet feeding apparatus comprising:
a tablet chute block having at least one chute for receiving a molding resin tablet;
a weighing unit provided below the tablet chute block, the weighing unit moveable between a first position to weigh and retain the molding resin tablet in the chute and a second position to release the molding resin tablet from the chute; and
a controller electrically connected to the tablet chute block and the weighing unit to accept or reject the molding resin tablet,
wherein the weighing unit moves to the second position when the controller rejects the molding resin tablet.

12. The apparatus of claim 11, wherein the tablet chute block has a plurality of chutes to receive molding resin tablets.

13. The apparatus of claim 12, wherein the tablet chute block is moved a distance that is the same as the interval between the chutes to receive the molding resin tablet.

14. The apparatus of claim 12, wherein the weighing unit is independently operated for each chute of the tablet chute block.

15. The apparatus of claim 12, wherein the weighing unit extends across the chutes of the tablet chute block.

16. The apparatus of claim 11, wherein the weighing unit is elastically deformed according to the weight of the molding resin tablet, and further includes a strain gauge for outputting an electric change caused by the elastic deformation.

17. The apparatus of claim 16, wherein the weighing unit is electrically connected to the controller, and further includes a converter for converting the electric change to a digital signal.

18. A method of feeding a molding resin tablet, the method comprising:
inserting a molding resin tablet into an upper opening of a chute of a chute block;
weighing the molding resin tablet in the chute;
determining whether the molding resin tablet is acceptable based on the weighing; and
removing the molding resin tablet from the chute block if the molding resin tablet is not acceptable, the removing of the molding resin tablet being accomplished by allowing the molding resin tablet to pass through the chute and out a lower opening of the chute.

19. The method of claim 18, further comprising:
moving the chute block together with the molding resin tablet if the molding resin tablet is acceptable.

20. The method of claim 18, further comprising:
inserting a plurality of molding resin tablets into a plurality of chutes of a chute block; and
collectively weighing the molding resign tablets; and
determining whether the molding resin tablets are acceptable based on the collectively weighing.

* * * * *